United States Patent [19]
Takeshita et al.

[11] Patent Number: 5,473,618
[45] Date of Patent: Dec. 5, 1995

[54] SEMICONDUCTOR INTEGRATED CIRCUIT HAVING A BUILT-IN TEST CIRCUIT

[75] Inventors: Yuuichi Takeshita; Masashi Arai, both of Tokyo, Japan

[73] Assignee: NEC Corporation, Tokyo, Japan

[21] Appl. No.: 172,744

[22] Filed: Dec. 27, 1993

[30] Foreign Application Priority Data

Jan. 7, 1993 [JP] Japan .................................. 5-000923

[51] Int. Cl.$^6$ .................................................. G06F 11/00
[52] U.S. Cl. .............................................. 371/22.5; 371/27
[58] Field of Search .................................. 371/22.1, 22.2, 371/22.3, 22.5, 25.1, 27; 324/158 R

[56] References Cited

U.S. PATENT DOCUMENTS

| | | | |
|---|---|---|---|
| 5,109,383 | 4/1992 | Chujo | 371/22.5 |
| 5,210,759 | 5/1993 | DeWitt et al. | 371/22.5 |

*Primary Examiner*—Vincent P. Canney
*Attorney, Agent, or Firm*—Young & Thompson

[57] ABSTRACT

The semiconductor integrated circuit having a built-in test circuit of the present invention is an IC having a circuit for screening products for shipment by measuring the maximum operating frequency of the IC by outputting the propagation state of a signal within the test circuit within an operation cycle of the IC, the circuit being composed of: an external clock pulse input terminal; a clock driver that inputs the external clock pulse and converts it to clock pulses of two phases, one being in phase with the external clock pulse and the other being in reverse phase; a test terminal into which is inputted a test execution signal; a one-shot circuit that generates a high-active output pulse when an active signal is inputted; a sequential circuit that performs transition of an output value in accordance with an output pulse from the one-shot circuit; a test circuit made up of a number n of latch circuits of identical or differing structure that hold and successively output to a next circuit a high-level signal D of an inputted logic value 1; a test register made up of a number n of serially connected latch circuits that hold the output of each of the latch circuits of the test circuit; and a data selector that switches between outputting to a number n of output terminals either the output value of the test circuit or the operation output of the IC.

4 Claims, 5 Drawing Sheets

SEMICONDUCTOR INTEGRATED CIRCUIT HAVING A BUILT-IN TEST CIRCUIT

BACKGROUND OF THE INVENTION

FIELD OF THE INVENTION

The present invention relates to a semiconductor integrated circuit having a built-in test circuit, and particularly to a semiconductor integrated circuit having a test circuit for screening mass-produced goods. Description of the Related Art The maximum value of the operating frequency of a semiconductor integrated circuit (hereinafter referred to as an IC) is generally determined by each transistor's switching speed, which is a constituent element of the IC, this switching speed depending on such factors as the gate length and the transistor logic threshold value generated by a diffusion process. When developing an IC, sufficient rating for a market product is carried out by using several test products as samples which are tested by being subjected to various conditions of use. Inevitably, even with products that have been sufficiently rated, there will be some products among completed articles that do not deliver the expected performance due to variations in raw materials and manufacturing conditions. As a result, various screening tests are carried out before shipment to prevent the shipment ment of defective products.

The measurement of maximum operating frequency is included among these tests. This test involves impressing a power source voltage set as the used standard to an IC to which is inputted a driving clock pulse from the outside, and testing whether or not the IC operates normally at the standard clock frequency. A concrete maximum operation frequency measurement uses an LSI tester in which the frequency driving the IC is set to a value higher than for standard use, inputting random test pattern data, and comparing the values outputted by the IC with expected values for each test cycle. If the resulting IC output values match the expected values, the IC is judged to be a product capable of meeting the use standards guaranteed to a user. If the values do not match, the IC is judged to be defective.

FIG. 1A is a timing chart for carrying out such a test, the relation of the clock pulse high width and the clock pulse low width to the clock time width T is normally T/2 for each. An increase in clock frequency means that the clock time width T will be reduced, and accordingly, the time width ½ T of the clock pulse high and clock pulse low, which are each ½ of the clock pulse time width, will also be reduced.

The performance of the above-described LSI tester will also improve along with the improvement of the performance of the tested IC. In particular, for measuring the performance of an IC in which the use standard for maximum operating frequency is set high, an LSI tester must have high-level performance , and in particular, must be capable of measuring high frequency, and for this purpose, high-performance, high-speed LSI testers have been developed. However, such high-performance LSI testers are extremely expensive, and while a few units may be used for research and development, installation of the large number of LSI testers necessary for use in screening during mass production would entail a huge investment in equipment and would result in an increase in IC manufacturing costs.

As a result, a conventional method of measurement in mass production screening employs normal IC testers of lower frequency that indirectly test the maximum operating frequency of an IC by setting the widths of only the clock pulse high and low alternately to less than ½ the clock time width of the maximum operating frequency of the use standard, inputting random test patterns to the IC, and comparing the outputted values of the IC with the expected values for each test cycle. In this case, if the outputted values and the expected values match for the time width of both the high and the low even when reduced, the IC is judged to meet the standards for maximum operating frequency, and if the values do not match, the IC is judged to be defective. A timing chart for this case is shown in FIG. 1B. In FIG. 1B, the clock time width T is the time width during which the IC can operate normally, the width of the clock pulse high and the width of the clock pulse low are alternately reduced to less than ½ the width of the maximum operating frequency and tested, and the IC meets the standards if the results of both are satisfactory.

However, setting each of the high width and the low width of the clock pulse to a reduced value and testing each IC twice leads to a lengthy test time and an increase in both screening and production costs, and prevents the provision of low-cost ICs to users.

SUMMARY OF THE INVENTION

The object of the present invention is to solve the above-described problems and provide an IC having a built-in test circuit capable of tests for screening during mass production without the use of high-cost LSI testers.

The IC having a built-in test circuit according to the present invention has a test circuit in which a plurality of latch circuits capable of predicting switching speed are serially connected. The quality of mass-produced articles is judged by inputting a signal of logic value 1 to this test circuit, simultaneously outputting from each latch circuit a logic value 1 propagated within a cycle designated by a clock pulse inputted from the outside, and comparing the outputted latch data with expected values to estimate the maximum operating frequency of that IC.

The means of actualizing this IC includes a clock driver that converts a single-phase clock pulse inputted from the outside into clock pulses of two phases: one clock pulse in phase with the inputted clock pulse and another of the reverse phase; a test terminal into which is inputted an active signal directing execution of a test; a one-shot circuit that generates high-active output pulses when an active signal is inputted to the test terminal; a sequential circuit that is reset by an output pulse of the one-shot circuit and that outputs pulses of a state value transitions performed according to the output clock pulse of the clock driver; a test circuit that is reset by an output pulse from the one-shot circuit and in which a plurality of serially connected latch circuits, according to the output of the sequential circuit, transmit and hold an inputted logic value 1; a test register that is reset by an output pulse of the one-shot circuit and that, according to the output of the sequential circuit, holds the output value of each latch making up the test circuit; and a data selector that, according to the output of the sequential circuit, switches between outputting to output terminals either the values held in the test register or the operation output of the IC.

The internal circuits of each latch circuit making up the test circuit may be of identical or differing circuit construction.

The above and other objects, features, and advantages of the present invention will become apparent from the following description referring to the accompanying drawings which illustrate the examples of the preferred embodiments of the present invention.

DETAILED DESCRIPTION OF THE PREFERRED EMBODIMENTS

Figure 1A:
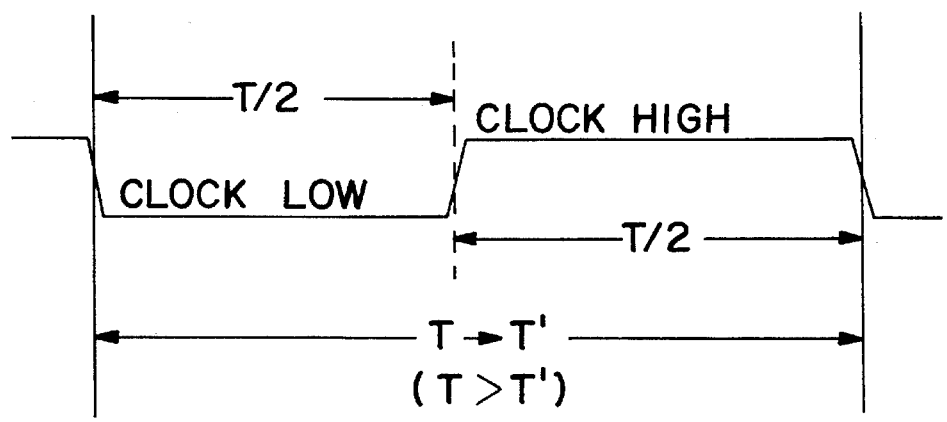
FIG. 1A is a clock timing chart showing an example of measurement of the maximum operating frequency of the prior art showing a case in which the clock pulse width is shortened.
Figure 1B:
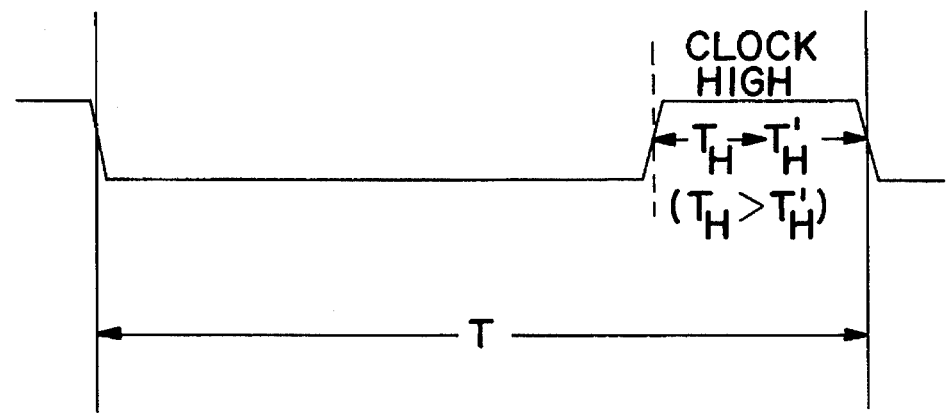
FIG. 1B is a clock pulse timing chart of an example of measurement of the maximum operation frequency of the prior art in which only the clock pulse high and clock pulse low are shortened without shortening the clock pulse.
Figure 1B:
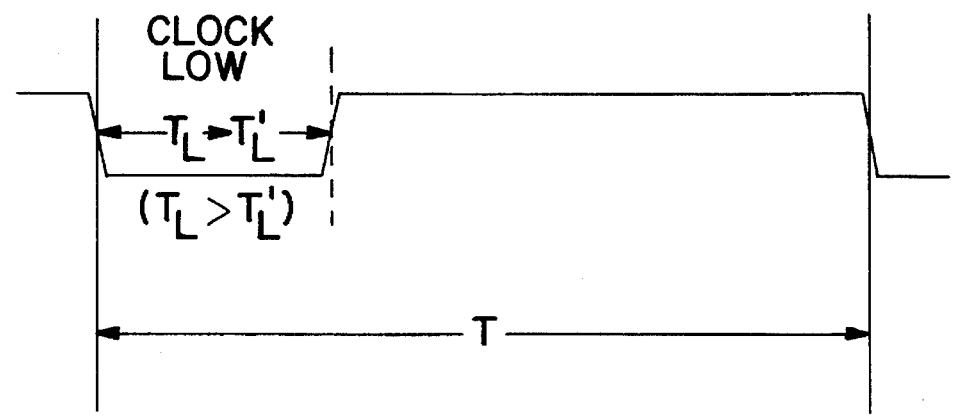
Figure 2:
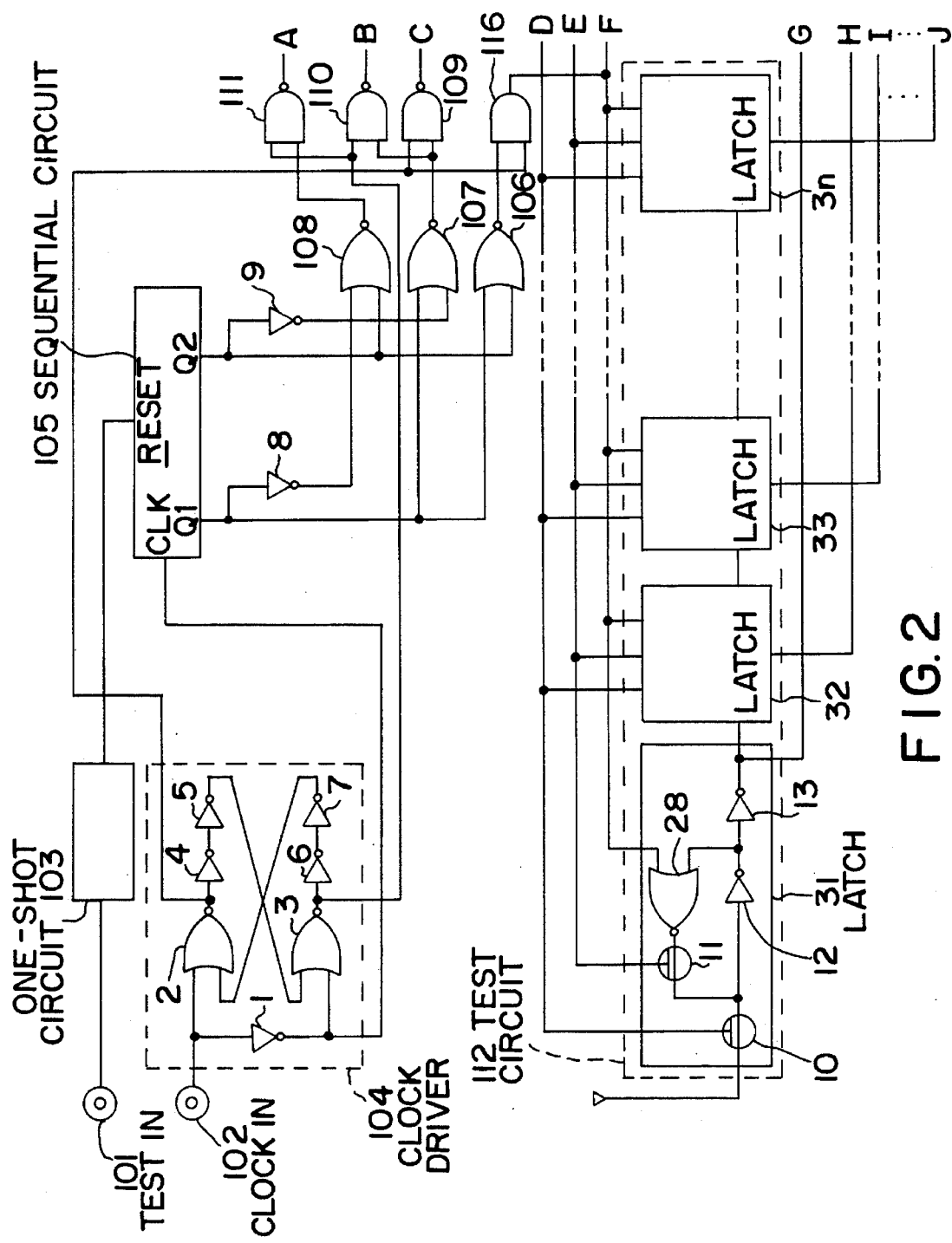
FIG. 2 is a circuit diagram showing the input portion of the first embodiment of the IC test circuit of the present invention.
Figure 3:
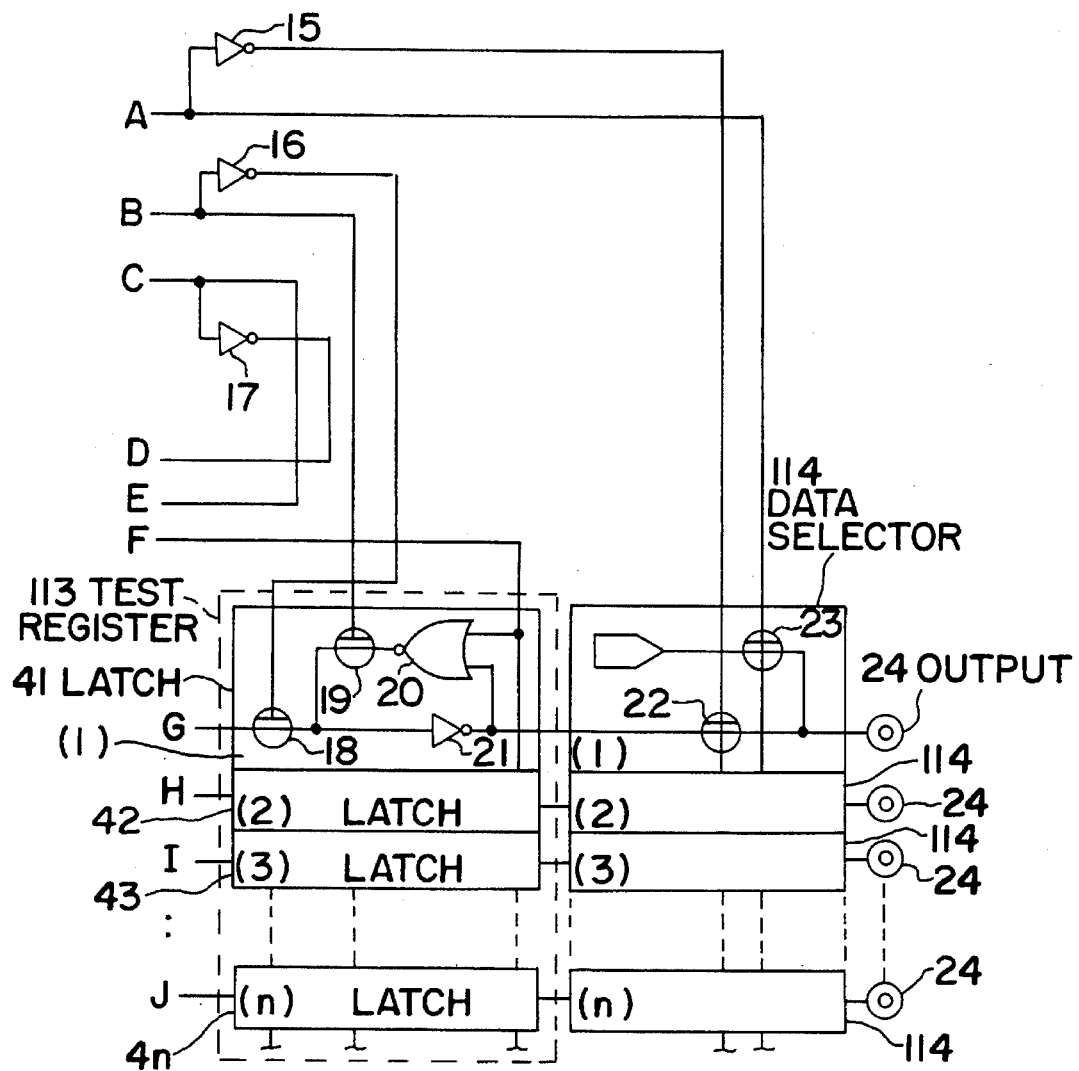
FIG. 3 is a circuit diagram of the output portion connected to the circuit of FIG. 2.

The IC test circuit of the first embodiment is a circuit used for measuring the maximum operating frequency of an IC by outputting the data propagation state within a test circuit 112 during the operation cycle of the IC, and, as shown in FIGS. 2 and 3, is made up of: an external clock pulse input terminal 102; a clock driver 104 that inputs the external clock pulse and converts it to clock pulses of two phases, C1, C2, one being in phase with, and the other being in reverse phase to the clock pulse inputted from outside; a test terminal 101 at which a test execute signal is inputted; a one-shot circuit 103 that generates a high-active output pulse when an active pulse is inputted to the test terminal 101; a sequential circuit 105 that performs transitions of output values according to an output pulse of the one-shot circuit 103; a test circuit 112 made up of latch circuits 31–3n of the same construction that each hold an inputted high-level signal D of logic value 1 and output successively to a next circuit; a test register 113 made up of serial latch circuits 41–4n for holding the output of each of the latch circuits of the test circuit 112; and a data selector 114 that switches between outputting to a number n of output terminals 24 either the output values of the test circuit 112 or the operation output data of the IC.

The one-shot circuit 103 is a circuit connected to the test terminal 101 that detects the rise of an inputted active signal and generates a pulse of set time width.

The clock driver 104 is a circuit made up of inverters 1, 4, 5, 6, 7 and NOR gates 2, 3, that frequency divides the single-phase clock pulse inputted from the external clock pulse input terminal 102 into clock pulses of two phases: a clock pulse C2 in phase with the input and a clock pulse C1 of the reverse phase.

The sequential circuit 105 is a circuit made up of two inputs, i.e., a clock pulse input (CLK) into which clock pulse C1 is inputted and a reset input (RESET) into which a pulse from the one-shot circuit 103 is inputted, and a set of outputs (Q1, Q2) for two outputs Q1, Q2. The sequential circuit 105 detects the trailing edge (trigger) of the clock pulse input and outputs the transition state value from (Q1, Q2). The output (Q1, Q2) of the one-shot circuit 103 is normally stabilized at the logic value (1, 1) state. When a pulse generated by the one-shot circuit 103 is inputted to (RESET), the output (Q1, Q2) of the one-shot circuit 103 makes a transition to logic value (0, 0), following which, with every rise of the clock pulse inputted to (CLK), the output value changes from (0, 1) to (1, 0) to (1, 1), and when the output value becomes (1, 1) the sequential circuit 105 again enters a stable state and transition of the output value is no longer performed.

The output (Q1, Q2) of the sequential circuit 105 is inputted to the NOR gates 106, 107, 108 either directly or indirectly by way of inverters 8, 9. NOR gate 106 outputs logic value 1 only when (Q1, Q2) is (0, 0), NOR gate 107 outputs logic value 1 only when (Q1, Q2) is (0, 1), and NOR gate 108 outputs logic value 1 only when (Q1, Q2) is (1, 0). The output of NOR gates 106, 107, 108 is inputted together with clock pulse C1 or clock pulse C2 to the test circuit 112, test register 113 or data selector 114 by way of NAND gate 109, 110, 111 or AND gate 116.

The test circuit 112 is a circuit of a number n of serially connected latch circuits 31, 32, –3n, each of the same construction made up of transfer gates 10, 11, inverters 12, 13, and NOR gate 28. Normally, in each latch circuit 31–3n, transfer gate 10 is in the OFF state and transfer gate 11 is in the ON state. However, only when the clock pulse C1 is at a high level and the output value of sequential circuit 105 is (0, 1), transfer gate 10 is in the ON state, transfer gate 11 is in the OFF state, and the latch circuits hold the inputted values from the data input. In other words, data is latched and the latched data is outputted to the next latch circuit and to test register 113.

The test register 113 is made up of a number n of latch circuits 41–4n of the same construction, i.e., parallel connection of latch circuits 41–4n, each made up of transfer gates 18, 19, an inverter 21, and a NOR gate 20, and each output from each latch circuit 31–3n of the test circuit 112 is the input data for each latch circuit 41–4n, respectively. In each latch circuit of the test register 113, transfer gate 18 is in the ON state, transfer gate 19 is in the OFF state, and all of latch circuits 41–4n simultaneously perform data latching of each latch circuit 31–3n of the test circuit 112 only when the output value of the sequential circuit 105 is (0, 1) and clock pulse C2 is at a high level.

The data selector 114 switches between the outputs of the test register 113 and the operation results of the IC according to the output of NAND gate 111, and outputs all of the output from n output terminals 24.

Figure 4:
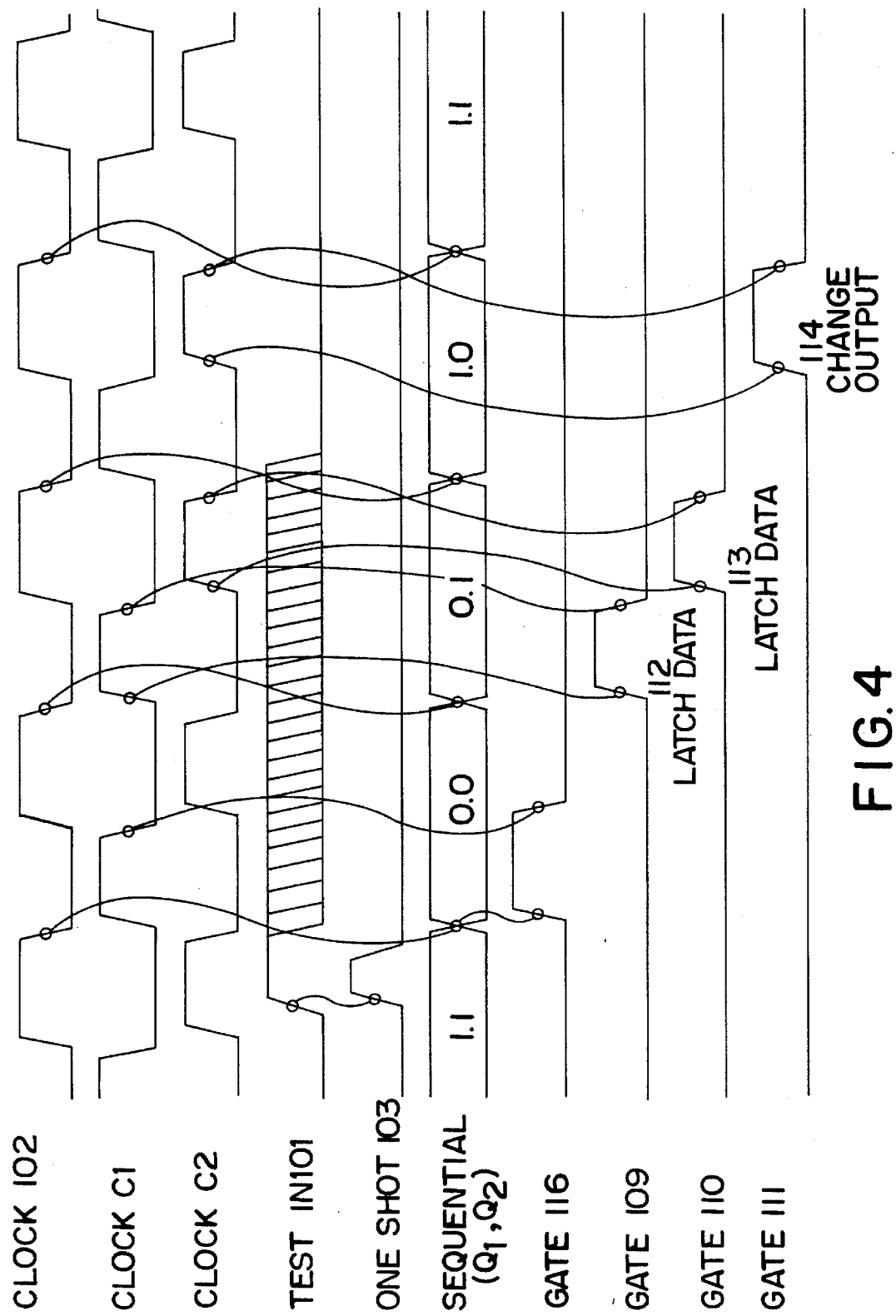
FIG. 4 is an operation timing chart of each part of FIGS. 2 and 3.

An explanation of the operation of the present embodiment will next be given with reference to FIGS. 2, 3, and 4.

The output (Q1, Q2) of the state value of sequential circuit 105 is (1, 1) until an active signal is inputted from the test terminal 101. When an active signal is inputted to the test terminal 101, a pulse signal is sent from the one-shot circuit 103 to the RESET of the sequential circuit 105, and when the sequential circuit 105 detects the rise of clock pulse C1 sent from the clock driver 104, i.e., the fall of the clock pulse inputted to the [external]clock pulse input terminal 102, the state value outputted from (Q1, Q2) is changed to (0, 0). This output value is sent to AND gate 116 by way of NOR gate 106, and while the clock pulse C1 inputted to AND gate 116 is at a high level, is sent as a reset signal to all of the latch circuits of the test circuit 112 and the test register 113, and when test circuit 112 and test register 113 are reset, all of the data held in latch circuits 31–3n, 41–4n becomes logic value 0.

When the sequential circuit 105 detects the next rise of the inputted clock pulse C1, the output of (Q1, Q2) changes to (0, 1), and while clock pulse C1 is at a high level, a data latch signal is sent by way of NOR gate 107 and NAND gate 109 to each of latch circuits 31—3n of the test circuit 112. According to this data latch signal, the first latch circuit 31 changes-transfer gate 10 to ON and inputs a high level from data input D, i.e., inputs and holds logic value 1, and after the passage of the delay time of the switching speed of the gates of inverters 12, 13, etc., sends logic value 1 to the next latch circuit 32. Each of the next latch circuits 32–3n, in the same way as the first latch circuit 31, both sequentially propagates the logic value sent from the preceding latch circuit to the next latch circuit and holds this logic value while the data latch signal is ON, i.e., while the clock pulse C1 is at a high level.

The number of latch circuits propagating this logic value 1 varies according to the low-level time width of the clock pulse inputted from the external clock pulse input terminal 102 at the time of measurement and the switching speed of each of the transistors [and other elements]making up each circuit, i.e., according to the length of the delay time. The expected value for an IC product during mass production can be estimated beforehand according to the designed expected value during development and the measured value of the limited number of samples obtained using a high-performance LSI tester.

When the latch signal is OFF and clock pulse C2 rises, the output of NAND gate 110 is sent as a data latch signal to each of latch circuits 41–4n of test register 113, and each of the latch circuits 41–4n simultaneously inputs and holds the logic value held in the corresponding latch circuit 31–3n of the test circuit 112, and outputs from n output terminals 24 by way of data selector 114.

In accordance with the next clock pulse, the output (Q1, Q2) of the sequential circuit 105 becomes (1, 0), and when clock pulse C2 rises, the output of NAND gate 111 is sent as the output data switching signal to data selector 114. The data selector 114, in accordance with this switching signal, switches to the data of the test circuit and outputs the output data during the IC test operation to output terminals 24.

As a result, in an IC provided with this type of test circuit 112, by comparing preset expected values with the output from this test circuit 112 and the output data from the IC operation, it can be judged whether or not the IC has operated normally and, from the number of latch circuits to which logic value 1 was propagated, whether the maximum operating frequency of the IC is within the range of the expected value. In other words, in determining the quality of such mass-produced ICs, it can at least be judged whether an IC is a product meeting the use standards for the maximum operating frequency without directly using an expensive high-performance LSI tester.

Figure 5:
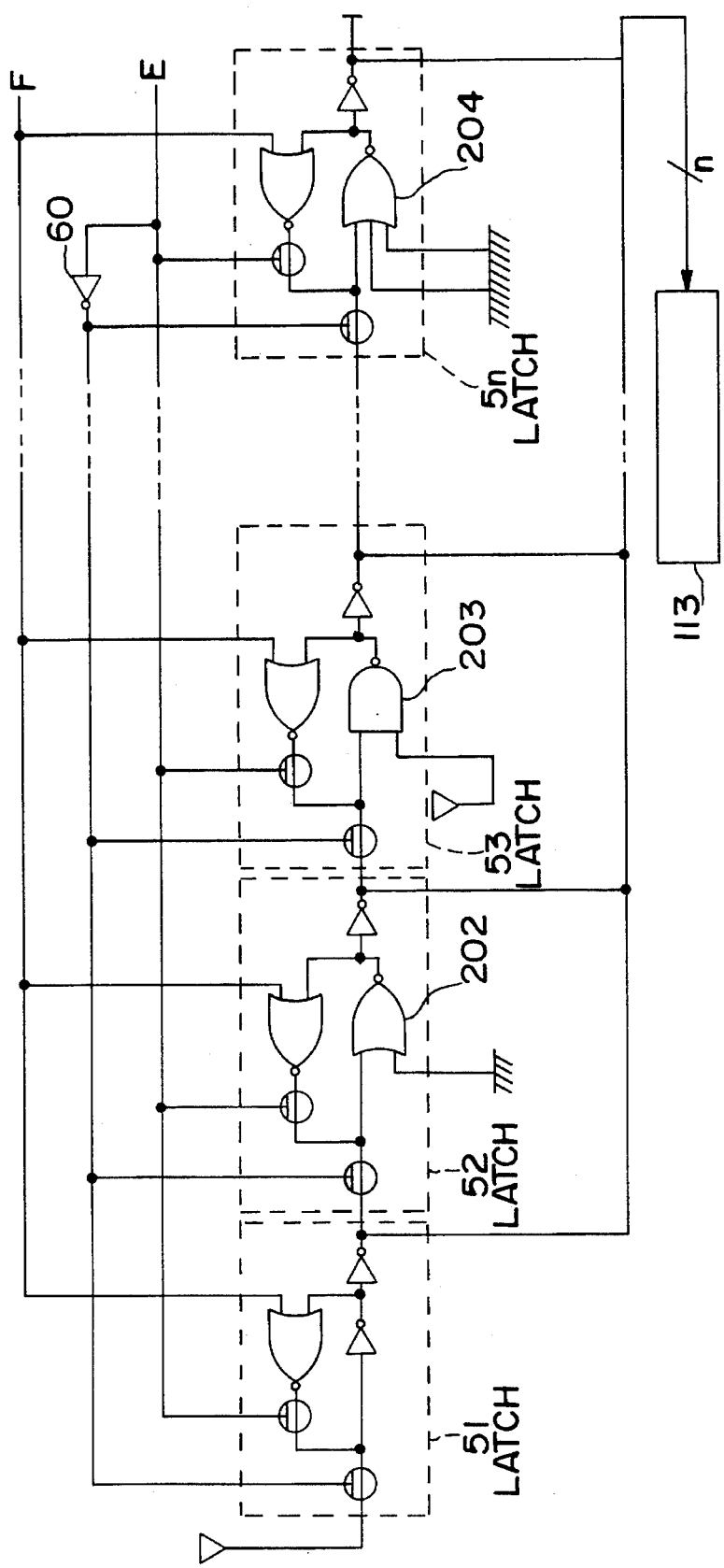
FIG. 5 is a circuit diagram of one portion of the second embodiment of the present invention.

In the first embodiment, all of the latch circuits 31–3n of the test circuit 112 are of the same circuit construction in order to effect a simplified design and production, but as in the second embodiment shown in FIG. 5, it is also possible to vary the combination of gates in each latch circuit. In other words, the test circuit 112' of the second embodiment substitutes latch circuits 51–5n for a portion of the latch circuits 31–3n of identical construction in the test circuit 112 of the first embodiment, while the remaining circuits are identical to those of the first embodiment. In FIG. 5, while the first latch circuit 51 is the same as latch circuit 31 in FIG. 2, in the next latch circuit 52 a NOR gate 202 is provided in the position of the inverter 12 of latch circuit 32, in the next latch circuit 53 a NAND gate 203 is provided in the position of the same inverter 12, and in the last latch circuit 5n a NOR gate of three inputs is provided. Into these gates is inputted, together with the input of the data transmission path, a logic value 0 for a NOR gate and a logic value 1 for a NAND gate. In other words, the test circuit 112' of this embodiment uses NOR gates 202, 204 and NAND gate 203 in place of inverters to provide a critical path in the data propagation path. When an output reset signal of AND gate 116 and an output shift signal of NAND gate 109 are inputted to each latch circuit 51–5n, in the same way as for the first embodiment but according to the switching speed of each of the constituent elements, logic value 1 is propagated, and that output is inputted to each latch circuit 41–4n of the test register 113.

The second embodiment thus modifies in various ways the composition of the latch circuits of the test circuit 112' and provides a critical path in the data propagation path, thereby increasing the accuracy of the measurement of the maximum operating frequency.

The number n of latch circuits is, in accordance with the above description, preferably three or more, and further, preferably greater than the number of the upper limit to which the logic value 1 is propagated. Further, the type and number of logic gates making up each latch circuit is not limited by the above-described examples, as long as the position to which the inputted logic value 1 is propagated can be confirmed by the output data.

It is to be understood that variations and modifications of the semiconductor integrated circuit having the test circuit disclosed herein will be evident to those skilled in the art. It is intended that all such modifications and variations be included within the scope of the appended claims.

What is claimed is:

1. An semiconductor integrated circuit having a built-in test circuit wherein the test circuit has a plurality of serially connected latch circuits of a predictable switching speed, characterized in that:

the held values in all of the latch circuits of the test circuit are reset to a logic value 0 according to a clock pulse inputted from the outside;

a signal of logic value 1 is inputted to the first latch circuit of the test circuit;

the signal of logic value 1 inputted to the first latch circuit is both sequentially propagated to and held by each of the latch circuits; and for every cycle designated by the clock pulse inputted from the outside, the held values of each of the latch circuits are simultaneously outputted to external output terminals.

2. A semiconductor integrated circuit having a built-in test circuit and comprising:

a clock driver that converts a single-phase clock pulse inputted from the outside to clock pulses of two phases, one in phase with the inputted clock pulse and the other in reverse phase;

a test terminal to which is inputted an active signal that directs a test execution;

a one-shot circuit that generates a high-active output pulse when an active signal is inputted to the test terminal;

a sequential circuit that is reset in accordance with an output pulse from the one-shot circuit and that outputs a plurality of state value signals on which transitions have been performed according to the output clock pulse of the clock driver;

a test circuit that is reset in accordance with an output pulse from the one-shot circuit and in which a plurality of levels of latch circuits are serially connected that, in accordance with output of the sequential circuit, successively transmit and hold inputted logic value 1;

a test register that is reset in accordance with an output pulse from the one-shot circuit, and that, in accordance with the output of the sequential circuit, holds the output value of each of the latch circuits making up the test circuit; and a data selector that, in accordance with output from the sequential circuit, switches between outputting to an output terminal either the held value of the test register or the operation output of the IC.

3. The semiconductor integrated circuit having a built-in test circuit according to claim 2 wherein the internal circuits of all of the latch circuits making up the test circuit are of the same construction.

4. The semiconductor integrated circuit having a built-in test circuit according to claim 2 wherein at least one internal circuit of the internal circuits of the latch circuits making up the test circuit is of different circuit structure.

* * * * *